United States Patent [19]

Ashar et al.

[11] Patent Number: 5,748,486
[45] Date of Patent: May 5, 1998

[54] BREADTH-FIRST MANIPULATION OF BINARY DECISION DIAGRAMS

[75] Inventors: Pranav Ashar, Princeton; Chao Cheong, Plainsboro, both of N.J.

[73] Assignee: NEC USA, Inc., Princeton, N.J.

[21] Appl. No.: 331,075

[22] Filed: Oct. 28, 1994

[51] Int. Cl.$^6$ .................................................. G06F 17/50
[52] U.S. Cl. ......................... 364/488; 364/489; 364/578; 364/DIG. 1
[58] Field of Search ..................... 364/488, 489, 364/491, 490, 578, DIG. 1, 251.6, 255.2, 255.7; 395/500, 800

[56] References Cited

U.S. PATENT DOCUMENTS

| | | | |
|---|---|---|---|
| 5,029,102 | 7/1991 | Drumm et al. | 364/489 |
| 5,099,450 | 3/1992 | Berkling | 395/800 |
| 5,243,538 | 9/1993 | Okuzawa et al. | 364/489 |
| 5,477,474 | 12/1995 | Southgate et al. | 364/578 |

OTHER PUBLICATIONS

K. Brace et al, Efficient Implementation of a BDD Package, Proc. of Design Automation Conference, pp. 40–45, Jun. 1990.

H. Ochi et al, Breadth–First Manipulation of Very Large Binary—Decision Diagrams, Proc. Of Internation Conference in Computer–Aided Design, pp. 48–55, Nov. 1993.

Minato et al., "Shared BDD with Attributed Edges for Efficient Boolean Fnc. Manipulation," IEEE, 1990, pp. 52–57.

Takahashi et al., "Fault Simulation for Multiple Faults Using Shared BDD Representation of Faults Sets," IEEE, 1991, pp. 550–553.

Jacobi et al., "Incremental Reduction of BDDs", IE$^3$, 1991, pp. 3174–3177.

Iwaihara et al., "Bottom–up Evaluation of Logic Programs Using Binary Decision Diagrams," IEEE, 1995, pp. 467–474.

Matsunaga et al., "Multi–Level Logic Optimization Using BDDs", IEEE, 1989, pp. 556–559.

Primary Examiner—Jacques H. Louis-Jacques
Assistant Examiner—Thai Phan
Attorney, Agent, or Firm—Philip J. Feig

[57] ABSTRACT

A breadth-first manipulation of reduced, ordered binary decision diagram representation of a logic circuit eliminates page access time bottlenecks encountered when obtaining nodes from secondary memory to primary memory by providing an orderly page access arrangement. The pointer to a node is the address at which the node is located in memory, from which address the memory block at which the node is located is determined. A look-up table is used to convert the memory block information into a variable index indicative of the level at which the node is located. The queue of ITE (if_then_else) requests is maintained on a per level basis.

15 Claims, 4 Drawing Sheets

**df_ite(*F,G,H*) {**
1. if (terminal case(*F,G,H*)) {
2.     return result ;
3. } else if (computed-table has the entry (*F,G,H*)) {
4.     return result ;
5. } else {
6.     Determine x, the top variable of (*F,G,H*) ;
7.     T = df_ite($F_x, G_x, H_x$) ;
8.     E = df_ite($F_{\bar{x}}, G_{\bar{x}}, H_{\bar{x}}$) ;
9.     if (*T* equals *E*)
10.         return *T* ;
11.     *R* = find_or_add_unique_table(*x,T,E*) ;
12.     insert_computed_table((*F,G,H*), *R*) ;
13.     return *R* ;
14. }
}

FIGURE 1

**bf_ite(*F,G,H*) {**
1. if (terminal case(*F,G,H*)) {
2.     return result ;
3. } else {
4.     bf_ite_apply(*F,G,H*) ;
5.     R = bf_ite_reduce( ) ;
6.     return R;
7. }
}

FIGURE 2

```
bf_ite_apply(F,G,H) {
1.   min_index = determine_top_variable_index(F,G,H) ;
2.   R = new_bdd_node(min_index) ;
3.   create_new_request(F,G,H,R) ;
4.   add (F,G,H,R) to queue[min_index] ;
5.   for (index = min_index;index ≤max_index;index + +) {
6.      x is the variable corresponding to index index ;
7.      do {
8.         (F,G,H,R) = fetch next request from queue[index] ;
9.         if (terminal case (F_x,G_x,H_x)) {
10.           R→T=result ;
11.        } else {
12.           next_index=determine_top_variable_index_(F_x,G_x,H_x) ;
13.           if (request corresponding to (F_x,G_x,H_x) already occurs in queue[next_index]){
14.              fetch THEN node corresponding to (F_x,G_x,H_x)
                    from queue[next_index] ;
15.              R→T=THEN ;
16.           } else {
17.              THEN=new_bdd_node(next_index) ;
18.              R→T = THEN ;
19.              create_new_request(F_x,G_x,H_x,THEN) ;
20.              add (F_x,G_x,H_x,THEN)to queue[next_index] ;
21.           }
22.        }
23.        if (terminal case($F_{\bar{x}},G_{\bar{x}},H_{\bar{x}}$)) {
24.           R→E = result ;
25.        } else {
26.           next_index=determine_top_variable_index ($F_{\bar{x}},G_{\bar{x}},H_{\bar{x}}$);
27.           if (request corresponding to ($F_{\bar{x}},G_{\bar{x}},H_{\bar{x}}$) already occurs in queue[next_index]) {
28.              fetch ELSE node corresponding to ($F_{\bar{x}},G_{\bar{x}},H_{\bar{x}}$) from queue[next_index] ;
29.              R→E = ELSE
30.           } else {
31.              ELSE = new_bdd_node(next-index) ;
32.              R→E = ELSE
33.              create_new_request($F_{\bar{x}},G_{\bar{x}},H_{\bar{x}}$,ELSE);
34.              add $F_{\bar{x}},G_{\bar{x}},H_{\bar{x}}$,ELSE) to queue[next _ index];
35.           }
36.        }
37.     } while (queue[index] is not empty) ;
38.  }
}
```

FIGURE 3 bf_ite_reduce( ) {
1.  for (*index* = *max_index*;*index* ≥ *min_index*;*index* - -) {
2.      *x* is the variable corresponding to index *index* ;
3.      do {
4.          $R$ = fetch next temporary node from *queue*[*index*] ;
5.          if ($R{\rightarrow}T$ has been forwarded to $T'$ ) {
6.              $R{\rightarrow}T = T'$ ;
7.          }
8.          if ($R{\rightarrow}E$ has been forwarded to $E'$) {
9.              $R{\rightarrow}E = E'$ ;
10.         }
11.         if ($R{\rightarrow}T$ equals $R{\rightarrow}E$) {
12.             forward $R$ to $R{\rightarrow}T$ ;
13.         } else if (*unique_table*[*index*] has entry ($x, R{\rightarrow}T, R{\rightarrow}E$)) {
14.             let $R'$ be the BDD node stored at the entry ($x, R{\rightarrow}T, R{\rightarrow}E$) ;
15.             forward $R$ to $R'$ ;
16.         } else {
17.             add $R$ to *unique_table*[*index*] under entry ($x, R{\rightarrow}T, R{\rightarrow}E$) ;
18.         }
20.     } while (*queue*[*index*] is not empty) ;
21. }
22. return either $R$ or the node to which it is forwarded ;
}

FIGURE 4

BREADTH-FIRST MANIPULATION OF BINARY DECISION DIAGRAMS

FIELD OF THE INVENTION

The present invention relates to breadth-first manipulation of binary decision diagrams and particularly to manipulation of reduced, ordered binary decision diagrams of the kind commonly encountered in computer-aided-design of logic circuits.

BACKGROUND OF THE INVENTION

Efficient manipulation of Boolean functions is an important component of many computer-aided-design tasks. A primary method of manipulating Boolean functions is based on the reduced, ordered, binary decision diagrams (ROBDD) representation. These methods are generally based upon if_then_else (ITE) operations. Previous methods for ROBDD manipulation have relied upon depth first recursive algorithms for the ITE operations.

The efficient representation and manipulation of Boolean functions is important in many applications. In particular, many problems in computer-aided design for digital circuits (CAD) can be expressed as a sequence of operations performed over a set of Boolean functions. Typical CAD applications include combinatorial logic verification, sequential-machine equivalence, logic optimization of combinatorial circuits, text sorting generation, timing verification in the presence of false paths and symbolic simulation.

In order to better understand ROBDDs a few definitions are helpful. A binary decision diagram (BDD) is a directed acyclic graph (DAG). The graph has two sink nodes labeled 0 or 1 representing the Boolean functions 0 and 1. Each non-sink node is labeled with a Boolean variable v and has two out-edges labeled 1 (or then) and 0 (or else). Each non-sink node represents the Boolean function corresponding to its 1 edge if v=1, or the Boolean function corresponding to its 0 edge if v=0.

An ordered binary decision diagram (OBDD) is a BDD with the constraint that the input variables are ordered and every source to sink path in the OBDD visits the input variable in ascending order.

A reduced ordered binary decision diagram (ROBDD) is an OBDD where each node represents a distinct logic function.

The if-then-else or ITE operator forms a Boolean function defined for three inputs F, G, H which computes: If F then G else H. This is equivalent to: ITE (F,G,H)=F·G+F·H. Since ITE is the logical function performed at each node of the ROBDD, it is an efficient building block for many other operations on the ROBDD.

There is a need today for manipulating ROBDDs having tens to hundreds of millions of nodes which cannot be met using conventional depth-first (DF) recursive algorithms. Depth-first algorithms have been the algorithms of choice for ROBDD manipulation because the recursive formulation for ROBDD manipulation lends itself naturally to a compact depth-first recursive implementation. An outline of such an implementation of the ITE operation, as described in an article by K. Brace et. al. entitled "An Efficient Implementation of a BDD Package" in the Proceedings of the Design-Automation Conference, pages 40–45, June 1990, is shown in FIG. 1. In addition, the depth-first recursive paradigm has been exploited to eliminate the temporary creation of redundant ROBDD nodes by performing isomorphism checks on the nodes in real time. That is, a new node is created only if a node with the same attributes does not already exist (see line 12 in FIG. 1). However, the use of depth-first algorithms has a disadvantage for very large ROBDDs arising from an extremely disorderly memory access pattern as described by H. Ochi et. al. in an article entitled "Breadth-first Manipulation of Very Large Binary-Decision Diagrams" in the Proceedings of the International Conference on Computer-Aided Design, pages 48–55, November 1993.

The depth-first approach is characterized by the property that a new ITE computation request with some top-variable is issued only after the final results of and previous ITE requests with the same top-variable are known. FIG. 1 shows that successive memory accesses correspond to successive nodes on paths in the ROBDDs F, G, and H. Since a typical node in a large ROBDD generally has a large in degree, it is impossible to ensure that an arbitrary pair of nodes next to each other on a path in an ROBDD are created at contiguous memory addresses or even in the same path. For example, in UNIX memory management, read and write from secondary storage are in units of one page. While the size of a page may depend on the environment, a page is usually a 4 KB block of memory located at 4 KB boundaries in UNIX on current processors.

The latency of fetching a page from secondary storage is multiple orders of magnitude greater than fetching a word from main memory. Using current technology, a page fetch takes on the order of 10 msec. If the process size exceeds the available main memory, the part of the process that is needed immediately can be moved from secondary storage to main memory only at the expense of moving some part out from main memory to secondary storage. In the case of ROBDD manipulation, if the ROBDDs that are being traversed are too large to fit in main memory, it is unlikely that the desired node will ever be in main memory. Therefore, each time an ROBDD node is visited, the complete page containing the ROBDD node must be fetched from secondary storage in the worst case. Such a situation would cause hundreds of millions of page faults for ROBDDs of the size of interest, making it virtually impossible to manipulate/create words using a depth first algorithm.

Ochi et. al. supra have proposed that the disorderly memory access pattern can be avoided by using a breadth-first (BF) iterative algorithm for ROBDD manipulation. Instead of the ROBDD operations being executed path-by-path (as in depth first manipulation), the operations are executed level-by-level where each level is associated with a specific variable index in the ROBDD. A direct result of breadth first manipulation is that the isomorphism check cannot be performed in real time and it becomes necessary to temporarily generate redundant nodes. The consequent overhead incurred by the generation of redundant nodes however, is small compare to the order of magnitude savings in run time resulting from the ordered memory access pattern.

A significant limitation of the present breadth first algorithms is that "pad nodes" have to be added to the ROBDD so that successive nodes on any path in the new BDD differ in their index by exactly 1. Since successive nodes along a path in the original ROBDD can differ in their index by an arbitrary amount, it is likely that a large quantity of pad nodes may have to be added.

Using such an algorithm results in the creation of so many pad nodes that the total node count increases by multiple factors for many circuits. This drawback manifests itself by significantly increasing the run time since pad nodes are treated in the same manner as original nodes and must be fetched from memory, and by limiting the size of ROBDD that can be built given an address space limit. As a result, the pad node method is impractical for manipulating large ROBDDs.

SUMMARY OF THE INVENTION

The present invention overcomes the heretofore described limitations of presently known breadth-first ROBDD manipulation algorithms by eliminating the requirement for pad nodes. The resultant algorithm achieves this result with only a negligible increase in CPU time and an insignificant perturbation of the ordered memory access pattern. Thus, the page access time bottleneck previously encountered when obtaining a node from secondary memory to primary memory is eliminated. Moreover, the present invention refers to a novel breadth-first ROBDD manipulation which does not require additional nodes for intermediate levels.

The result is a method of performance breadth-first ROBDD manipulation which moves faster than the pad node approach by multiple factors. The present invention allows for the creation of BDDs for very large portions of chips, something which has been previously considered nonviable. Moreover, the novel method is machine independent and has been ported without modifications to SPARC, SGI and NEC EWS based machines.

The present invention provides a novel method of determining the variable index of an ROBDD node in order to maintain an ordered memory access even when the ROBDD contains many nodes.

A novel method of sorting of requests and nodes to be processed at a given level during ROBDD manipulation provides for an ordered memory access even when there are many nodes in the ROBDD. The level of a node can be determined without fetching the node from memory. The pointer to a node is the address at which the node is located in memory. The object is to maintain nodes to be fetched together at locations close to each other in memory.

A specified subset of bits of the address of the node corresponds to the block of memory in which the node is located. Nodes belonging to the same level in the BDD are stored in the same block of memory. A table in main memory maintains the relationship between the block in memory and the level in the BDD. The level of a BDD node can therefore be determined from this table.

The ITE requests are queued for each level. A new node is created during each ITE operation. This node can be at a level arbitrarily below the current level. Sorting requests on a per level basis maintains an orderly memory access pattern.

The invention will be better understood when the following description is read in conjunction with the accompanying drawing.

BRIEF DESCRIPTION OF THE DRAWING

FIG. 1 is pseudo-code for a depth-first recursive ROBDD manipulation;

FIG. 2 is pseudo-code for a breadth-first ROBDD manipulation;

FIG. 3 is pseudo-code of a bf_ite_apply (F,G,H) algorithm;

FIG. 4 is pseudo-code of a bf_ite_reduce ( ) algorithm; and

DETAILED DESCRIPTION

Figure 5:
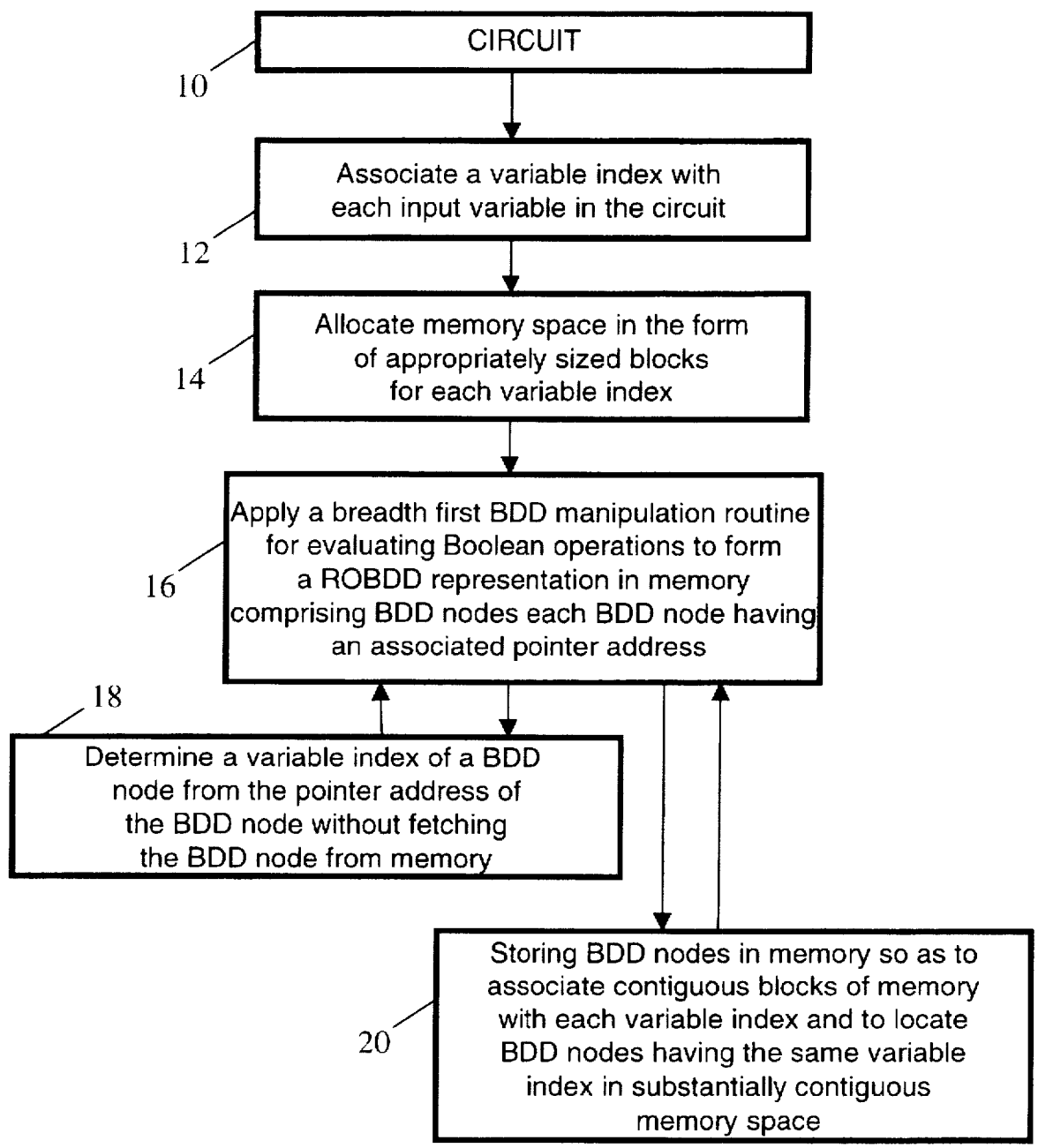
FIG. 5 is a flow diagram of the present invention.

Referring to figures, a basic outline of a preferred algorithm for breadth-first computation of ITE is shown in FIGS. 2, 3 and 4. The same code with only minor modifications can be used to execute in a breadth-first manner any Boolean operation with an arbitrary number of arguments.

The first step is an "apply" phase where the result BDD is created. The essential difference between depth-first and breadth-first approaches is that in the breadth-first approach a new ITE computation request with some top-variable is issued before the final results of all previous ITE requests with the same top-variable are known. The top-variable of a set of BDDs is the smallest of the top variables of those BDDs. As a result, isomorphism check cannot be done in real time, and the result BDD may contain redundant nodes. The second step is a "reduce" phase, which removes redundant nodes from the BDD and generates the final ROBDD.

A detailed description of both the apply and reduce steps follow with an analysis of the memory access patterns generated during both steps.

FIG. 2 is a general outline of the breadth-first ROBDD manipulation which shows that the algorithm bf_ite_apply (F,G,H) shown in FIG. 3 is applied before application of the algorithm bf_ite_reduce ( ) shown in FIG. 4 so that the final ROBDD is achieved.

FIG. 3 is pseudo-code of the algorithm bf_ite_apply (F,G,H) which is the top down (from the root variable to the leaves) processing of outstanding requests to compute the ITE of ROBDD triples. In general, two new ITE requests are issued each time an ITE request is processed. The result for a new request is directly available if a terminal case is encountered. Otherwise, a new node is allocated for a new request if an identical request has not already been issued in the past. Processing an ITE request requires that the root node of each of its argument ROBDDs be fetched if the top variable of that ROBDD is the same as the top variable of the argument triple.

The important aspect of the breadth-first algorithm is that the outstanding ITE requests are processed strictly in increasing order of these top variables. The convention used is that of variable index increase from the root to the leaves. Thus outstanding ITE requests having the same top variable index are processed consecutively. The result is temporal locality in the access of the ROBDD nodes corresponding to a given variable index. If it can be ensured that the ROBDD nodes for each variable index are stored in contiguous locations in memory, the temporal locality translates into spatial locality. The ability to introduce spatial locality in the memory access during ROBDD creation is a fundamental reason for using breadth-first manipulation.

A levelized request queue enables the processing of outstanding ITE requests in appropriate order. One queue is created for each variable index. Each time a new request is generated, the request is placed in the appropriate queue corresponding to the top variable of its argument triple. A new request can only be placed in a queue with index greater than the current index. The queues themselves are processed in the order of increasing variable index.

There are two issues which must be resolved to ensure the absence of randomness in the access pattern.

An issue arising from the described method is the compilation of the top-variable issue. Variable index computation presents a difficulty because the variable index associated with an ROBDD node is normally stored as an entry in the node structure itself. Consequently, the variable index for a node cannot be computed without fetching the node from memory.

The problem is manifest at lines 8, 12 and 26 of the pseudo-code shown in FIG. 3. In line 8, the next request to be processed is fetched from the request queue. For example, if X is the top-variable of the triple (F,G,H), then the top-variable index of the triple is known. However, the root nodes of the individual ROBDDs, F, G, and H do not necessarily have the same variable index x. If the variable index of root node $F_1$, for example, is greater than x, then $F_x=F$ and $F_{\bar{x}}=F$, thus it is not necessary to fetch node F from memory in order to obtain the co-factors. However, in order to reach this conclusion, it was necessary to compute the top variable index of F and therefore F had to be fetched from memory. In either case, the node for F is fetched from memory. If the top variable index of F is greater than x, fetching F from memory corresponds to an out-of-order memory access.

In lines 12 and 26 it is necessary to determine the top-variable indices corresponding to the positive and negative co-factor triples, respectively, in the newly generated requests. It is necessary to know the top-variable indices so that the new requests can be placed in the appropriate queues. The computation of the top-variable indices of these two triples is required because no relationship is imposed in an ROBDD between the index of parent and child nodes except that the index of the child must be greater than that of the parent. In order to make the computation of indices, six co-factors in the two triples must be fetched. Since these fetches are nodes having indexes greater than the current index, they are are-of-order memory accesses. It is desirable to be able to compute the two top-variable indices without out-of-order accesses.

Another issue to be resolved manifests itself at lines 13 and 28 of the pseudo-code in FIG. 3. The issue concerns accessing the queue associated with a newly issued request. Before a new request is issued, a check must be made whether an identical request has been issued previously. A table look up in the appropriate queue with the index next-index used for this check. If a duplicate request exists in the queue, it must be fetched. If a duplicate request does not exist, a new request must be issued and inserted into the queue. The only restriction on next-index queue is that it be greater than the current index. In addition, there is no relationship between the top-variable indices for successfully issued requests. This lack of relationship creates the potential for randomness in the memory access pattern. It is desirable to perform the lookup into the queues in order of increasing index.

As will be described in detail below, it is the solution to resolve these two issues of computing the variable indexes and checking for duplicate requests without introducing randomness in the memory accesses which is the improvement provided by the present invention over the Ochi et. al. approach. The solution uses a significantly lower penalty in terms of additional memory usage and at the expense of a negligible overhead in CPU time.

FIG. 4 shows pseudo-code for removing redundant nodes from the BDD by performing a bottom-up traversal of the BDD nodes. A redundant BDD node is a node with identical THEN and ELSE nodes, or a node such that another node with identical attributes already exists in the unique table. The corresponding checks are performed in lines 11 and 13 of the code in FIG. 4. If the node is found to be redundant, it is forwarded to the node which should take its place. An implementation is as follows: if node R is to be forwarded to $R^1$ set R→E to some predefined value and set R→T to $R^1$. In order to determine if a node R has been forwarded, R→E is checked for the predefined value.

The nodes to be processed are accessed for the levelized queue, but in order of decreasing variable index. Therefore if the nodes belonging to the same level are stored in contiguous memory locations, there is a spatial locality of addresses when fetching the node. Still, there is potential for randomness in the memory access pattern for the following reason.

The first step in the processing of a node R involves checking if R→T and R→E have been forwarded (see lines 5 to 10, FIG. 4). If R→T has been forwarded, then it must be reassigned to the node to which it has been forwarded. In order to check whether R→T has been forwarded requires that R→T be fetched from memory. Since the index for R→T can be arbitrarily greater than the index for R, and since there is no relationship between the variable indices of two nodes checked for forwarding one after the other, the fetch introduces randomness into the memory access pattern. The potential for random access must be removed if performance of the algorithm is not to degrade once the BDD reaches a certain size. Ideally, all checks for node forwarding belonging to a given level should be performed consecutively.

The common cause for all three issues is that the index of the child node can be arbitrarily greater than the index of the parent. The prior art pad node solution requires the addition of nodes in the ROBDD until the index of each child node is either equal to one more than the index of its parent node or the child node is a terminal node. The effect of this technique is to potentially increase the memory requirement by multiple factors in order to remove the randomness in memory access. In effect, the increased memory requirement nullifies the advantage of the ordered memory access.

The present invention, which will now be described in detail, provides for a method of breadth first ROBDD manipulation without the need for pad nodes and associated overhead. A novel method of determining the variable index of an ROBDD node and appropriate sorting of the requests and nodes to be processed at a given level during "apply" and "reduce" provide for the improved performance of the breadth-first ROBDD manipulation.

In order to ensure spatial locality in memory accesses, it is necessary to ensure that ROBDD nodes with the same top-variable index are stored in contiguous memory locations. In order to achieve this result, the memory manager must be able to allocate memory in the form of appropriately sized blocks with each block being associated with a particular variable index. Memory for a new ROBDD node is allocated from within the block associated with the variable index of the node. An additional block is allocated for a variable index when all previously allocated blocks for that index are filled.

A collated benefit of such an organization of ROBDD nodes in memory is that for the address of a node, it can be determined which block of memory the node belongs and hence its variable index. Thus, the variable index of the node is determined directly from the address (pointer) of the node. The node itself does not need to be fetched from memory. This ability to determine the variable index without fetching the ROBDD node from memory enables resolution of the first issue discussed above. As a consequence, there is an orderly page access during BF manipulation.

This method of computing the variable index is not completely free of overhead. But, the overhead is sufficiently small that it can be neglected for practical purposes.

Since the goal of the BF approach is to maximally utilize each page access, preferably a block size of one page (4 Kbytes on most current UNIX systems) is used. Since the variable index is determined directly from the address of a node, the corresponding field in the ROBDD node structure is no longer necessary. The remaining fields in the node structure are (1) REFERENCE_COUNT (2) THEN (3) ELSE (4) NEXT. The REFERENCE_COUNT field maintains a count of the fanins to the node, the THEN and ELSE fields store pointers to the THEN and ELSE nodes, respectively, and the NEXT field stores a pointer to another node with the same variable index and is used to maintain a unique table as described by Brace et al in an article entitled, "An Efficient Implementation of a BDD Package" in the Proceedings of the Design Automatic Conference, pages 40 to 45, June 1990. Each of these fields is 4 bytes wide, making the total size of each ROBDD node field equal to 16 bytes. A 4 KByte block would, therefore, accommodate 256 ROBDD nodes. Therefore, fetching a page from secondary storage puts into main memory 256 ROBDD nodes.

The variable index is compiled in the following manner. A 32 bit address space (corresponding to 4 GBytes of maximum per process addressable memory as provided by most microprocessors) and a 4 KByte block size implies that there can be at most 1M blocks at any given time. The higher 20 bits of the address of a node determine the block to which the node belongs. The correspondence between a block and the variable index to which it corresponds is maintained by means of a table (referred to as the block-index table) with 1M entries. Each entry is a short integer corresponding to a variable index. It is, therefore, two bytes wide. This table can be located anywhere with the restriction that the 1M entries be contiguous. A table with only 1M entries is small enough so that it is simple matter to find a location to place the table. In addition, given its small size and the large number of times that variable indices need to be computed, the table is almost guaranteed to always remain in main memory and never be placed in secondary storage. In order to compute the variable index, the ROBDD node address is first shifted to the right until the 20 bits identifying the block occupy the appropriate positions. The shifted 20 bits are now used as an offset address to index the block-index table to fetch the variable index. Using a typical CPU architecture, the right shift requires one instruction, and adding an offset to the base address requires another instruction. Therefore, the described method requires two instructions in addition to the actual memory fetch.

The second issue to be resolved is associated with checking for duplicate request during the apply algorithm shown in FIG. 3. Having a queue of requests to process at the current level, the goal is to remove the randomness in page access. In order to achieve this goal the requests are processed at the current level in the order of increasing variable indices of the two new requests that issue from each of the requests. This is performed in the following manner. In the first pass through the current request queue, the new requests issued from requests which new requests belong to the level immediately below the current are processed immediately. Other requests are stored in an array of lists, with each list corresponding to a level below the current level. The described process corresponds to a counting sort. After the first pass is complete, the requests in the lists in the newly created array are processed in the order of increasing level. Since there is no relationship between the top-variable indices of the two new requests issued from the same request, a request may appear in two lists at the same time, one for the new request corresponding to the positive co-factor, and the other corresponding to the negative co-factor. Processing the requests in this manner ensures that all the look ups into a particular queue are performed consecutively, thereby removing any randomness.

The randomness is removed at the cost of doing more than one pass through the current request queue. The effective number of passes required is only between 1 and 2 depending on the number of requests that are processed in the first pass. Also, the new array of lists is at most of size equal to the number of levels, and is therefore, very small. The creation of a new list per level does not cost any additional memory since the requests were already in a list before (the list corresponding to the queue to which they belong). The requests already have a NEXT field in their structure which can be used to point to the next request in a list. The requests only need to be removed from the original list and put in a new list. A request may need to be duplicated if the top-variable indices of the two new requests issued from the request (corresponding to the positive and negative cofactors) are different. The duplication is required since the request must be placed simultaneously in the two lists corresponding to the two top-variable indices. Even though there exists a potential for duplicate requests, this approach is superior to existing approaches.

The third issue to be resolved is the potential for random page-access during the check for forwarded nodes during the reduce algorithm shown in FIG. 4. The solution is analogous to the case of checking for duplicate requests during the apply algorithm in FIG. 3. The problem arises because of a lack of a relationship in the indices of the nodes that are successively checked for forwarding. The solution is the use of more than one pass, and the maintenance of an array of lists (one list for each level below the current level) for nodes to be processed in the second pass. The expression R→T is processed during the first pass only if the level of R→T and R→E are different. Using this approach, all checks for forwarding of nodes belonging to a given level are performed consecutively. Therefore, there is no randomness in the page-access pattern.

The costs associated with this solution are similar to the costs associated with avoiding random access when checking for duplicate nodes. The array size is very small and no additional memory is needed for the new lists. Additional memory is not needed because the ROBDD node structure already has a NEXT field to be used to maintain the lists in the unique table. Since a node is not placed in the unique table until it has been processed during the reduce algorithm the NEXT field can be used to maintain the desired lists.

If there are no free nodes in the associated memory space for the level when a new temporary node should be generated, garbage collection is performed. Garbage collection serves two primary purposes: free memory for subsequent use and prevent fragmentation of the memory used by a single ROBDD.

Several Boolean operations must be performed before the ROBDDs for the primary output are created. Dead nodes are created when freeing intermediate ROBDDs and freeing redundant nodes. The memory occupied by the dead nodes can be reused by new nodes. A preferred method for reclaiming memory used by dead nodes is called a reference_count garbage collection strategy. According to this strategy a list of nodes (called Free_List) that can be reused is maintained. When a new node is to be allocated, the Free_List is checked for available nodes. If a dead node is available, it is removed from Free_List and reused for the new node. Alternatively, if there are not any dead nodes, the new node is allocated new memory. As a result of the level organization employed in the present invention. A separate Free_List is maintained for each level.

In order to identify dead nodes, a reference_count field is maintained in the node data structure. The reference-count field contains a count of the number of nodes that refer to the particular node. When the count for a particular node becomes zero, the node is considered a dead node. When a node is considered dead, the reference_count field of both of its two children nodes must be decremented by one count. Therefore, declaring a node to be a dead node has a potentially cascading effect down through the ROBDD. Thus, the function of the reference_count garbage collector is to traverse the nodes in a ROBDD in top-down manner, and if the reference_count of a mode is zero, the node is considered dead and the field of the children nodes are decremented by one count. As is done with the other algorithms comprising the present inventions, the traversal is performed on a level-by-level basis in order to avoid random page-access. The queue at a level comprises the dead nodes at that level and the nodes whose reference_count must be decremented. In practice, the reference_count garbage collection is called at periodic intervals, for example, whenever the number of nodes at a level doubles. The primary advantage of the described reference_count procedure is its speed.

A potential difficulty with the described garbage collection schemes is that by using the dead node memory first where the dead nodes can be scattered throughout a number of pages in memory, spatial locality may be partially lost. In order to avoid this difficulty, a stop-and-copy mechanism copies to a new address space only those nodes that are not dead, i.e. alive. The address space previously used by the copied node is discarded. The result is the removal of the fragmentation caused by the reference_count scheme. Since the copying of all alive nodes is more time consuming than the reference_count process itself, the stop-and-copy mechanism is only called after there is a sufficiently large quantity of dead nodes. Preferably, the stop-and-copy mechanism is only called for those levels with a large quantity of dead nodes and not for all levels.

In actual implementation of the invention, the ITE request comprise five fields: arguments F, G, and H, request node R and NEXT field used for maintaining lists. A separate structure for ITE requests would require allocation of 20 additional bytes for each BDD node allocated during the apply algorithm. These bytes would remain until the request is processed.

The requirement for additional bytes is avoided by using the BDD node structure for the ITE requests and overloading the memories of the various fields. The reference_count field maps to F, THEN to G, ELSE to H, NEXT to NEXT, and the BDD node itself is the result field R. The same 16 bytes are initially used for the ITE request and subsequently for the BDD node.

Having an address space of 32 bits and a page size of 4 KB, the block-index table would have a maximum 1M entries, permitting construction of a flat statically allocated table. The advent of 64 bits of address space will render a flat table infeasible. A solution to this problem is to make the table hierarchical, allowing the memory used by the table to dynamically increase. The cost is increased overhead since more instructions are required for index computation.

FIG. 5 is a block diagram of the present invention. Circuit 10 is to be subjected to a breadth first ROBDD manipulation. A variable index is associated with each input variable in the circuit 12. Memory space is allocated in the form of appropriately sized blocks for each variable index 14. A breadth first BDD manipulation routine for evaluating Boolean operations to form a ROBDD representation in memory comprising BDD nodes, each BDD node having an associated pointer address 16. In the process of the breadth first routine, when a variable index needs to be determined for a BDD node, it is determined from the pointer address of the BDD node without fetching the BDD node from memory 18. Also in the process of the breadth first routine, when new BDD nodes are created, they are stored in memory so as to associate contiguous blocks of memory with each variable index, thereby locating BDD nodes having the same variable index in substantially contiguous memory space 20.

In summary, the present invention using a breadth-first implementation is order of magnitudes faster than depth-first implementation when the BDD size exceeds main memory. The overhead is manageable. The present implementation is superior to the pad node method in terms of memory requirements and run time.

TABLE I

Table I shows the result of running the present invention on circuits from IWLS '93 benchmark set and Indust1 and Indust2 are from industry.

| Circuits | # Primary Inputs/ Primary Outputs/Gates | # BDD Nodes $\times 10^6$ | Machine Configuration | Elapsed Time |
|---|---|---|---|---|
| C2670 | 233/140/1161 | 2.53 | 64 MB sparc 10/41 | 0:23:34 |
|  |  |  | 128 MB sparc 2 | 0:19:21 |
| C3540 | 50/22/1667 | 4.22 | 64 MB sparc 10/14 | 0:20:56 |
|  |  |  | 128 MB sparc 2 | 0:11:01 |
| C6288-X | 32/32/2416 | 20.2 | 64 MB sparc 10/41 | 9:20:26 |
| s9234 | 247/250/5597 | 3.85 | 64 MB sparc 10/41 | 0:06:01 |
|  |  |  | 32 MB sparc 2 | 0:24:43 |
|  |  |  | 128 MB sparc 2 | 0:06:38 |
| s38417-X | 1664/1742/22397 | 103.8 | 64 MB sparc 10/41 | 26:07:06 |
| Indust1 | 1133/1106/21698 | 5.37 | 64 MB sparc 10/41 | 0:19:23 |
|  |  |  | 128 MB sparc 2 | 0:20:58 |
| Indust2-X | 2131/2304/42617 | 29.6 | 64 MB sparc 10/41 | 9:20:24 |

The elapsed times for large ROBDDs shown in Table I clearly demonstrate the ability of the present invention to build and manipulate very large ROBDDs in short run times. For example, the 3.85 million node ROBDDs for s9234 were built on a SPARC 2 machine with only 32 MB of main memory in approximately 25 minutes. In order to create the same ROBDDs using presently available ROBDD packages from Carnegie Mellon University (CMU) requires approximately 48 hours. The present invention increases the speed by a factor of 120. Similarly, it is possible, using the present invention, to build ROBDDs with about 104 million nodes for the first 7509 gates of s38417 in 26 hours on a SPARC 10/41 machine with 64 MB memory. The CMU package can only build ROBDDs with 7.8 million nodes for the first 4807 gates in 43 hours on the same machine. The described method provides a solution which is faster by a factor of about 40 for the first 4807 gates. Similar speed improvement is obtained consistently when the ROBDD sizes are much greater than the available main memory. The orderings in the tests were generated using the ordering algorithm of Malik et al entitled "Logic Verification Using Binary Decision Diagrams in a Logic Synthesis Environment" in Proceedings of the International Conference on Computer-Aided Design, pages 6 to 9, November 1988.

Any Boolean operation can be expressed in terms of an ITE operation. While the foregoing description refers to ITE operations, the invention is not so limited and encompasses any Boolean operation that may be expressed in terms of ITE operations. Even if a Boolean operation is not expressed in terms of ITE operations, but the breadth first binary decision diagram manipulation routines are modified specifically for a particular Boolean operation, the invention performs in the same manner as that using ITE operations in order to achieve substantially the same result. For example, AND (f,g)=ITE (f, g, 0). The pseudo-code shown in FIGS. 2, 3 and 4 can be modified specifically to perform the AND (f, g) directly, without being expressed as an ITE operation. In such a case, a breadth first binary decision diagram manipulation routine for evaluating the Boolean operation directly is applied.

In actual use, a circuit to be fabricated is converted by computer-aided design using the present invention into an ROBDD in the form of information contained in memory. The information is used as the basis for fabricating the circuit in a known manner.

While there has been described and illustrated a preferred embodiment of a breadth-first manipulation of binary decision diagrams, it will be apparent to those skilled in the art that variations and modifications are possible without deviating from the broad principles and spirit of the invention which shall be limited solely in the scope of the claims appended hereto.

What is claimed is:

1. A computer-aided design method of obtaining a reduced ordered binary decision diagram in memory comprising the steps of:

applying a breadth first binary decision diagram manipulation routine for evaluating Boolean operations to form a reduced ordered binary decision diagram representation in memory comprising binary decision diagram (BDD) nodes each BDD node having an associated pointer address;

determining a variable index of a BDD node from the pointer address of the BDD node without fetching the BDD node from memory; and storing BDD nodes in memory so as to associate contiguous blocks of memory with each variable index and to locate BDD nodes having the same variable index in substantially contiguous memory space.

2. A computer-aided design method of obtaining a reduced ordered binary decision diagram in memory, comprising the steps of:

applying a breadth first binary decision diagram manipulation routine for evaluating Boolean operations to form a reduced ordered binary decision diagram representation in memory comprising nodes each node having an associated pointer address;

determining a variable index of a node from the pointer address of the node without fetching the node from memory; and storing nodes in memory so as to associate continuous blocks of memory with each variable index and to locate nodes having the same variable index in substantially continuous memory space, wherein said associating a block of memory with a variable index comprises the steps of:

forming a block-index table in a memory;

selecting values of predetermined bits of the address of a node in the reduced ordered binary decision diagram to determine the memory block in which said node is located; and looking up in said block-index table a variable index associated with the memory block in which said node is located, thereby determining the variable index of said node without fetching said node from memory.

3. A computer-aided design method as set forth in claim 2, where Boolean operation requests are processed in order of increasing top-variable indices by maintaining a request queue for each index and processing the request queues in order of increasing index.

4. A computer-aided design method as set forth in claim 3, where Boolean operation requests in a queue are processed in the order of increasing top-variable index of the new Boolean operation requests generated by the Boolean operation request.

5. A computer-aided design method as set forth in claim 4, further comprising checking for redundant nodes for each index according to the order of increasing top-variable index of the children nodes and removing any redundant node.

6. A computer-aided design method of obtaining a reduced ordered binary decision diagram for a circuit in memory comprising the steps of:

applying bf_ite to Boolean operations representative of a circuit to form a reduced ordered binary decision diagram representation in memory comprising binary decision diagram (BDD) nodes each node having an associated pointer address;

determining a variable index of a BDD node from the pointer address of the BDD node without fetching the BDD node from memory; and storing BDD nodes in memory so as to associate contiguous blocks of memory with each variable index and to locate BDD nodes having the same variable index in substantially contiguous memory space.

7. A computer-aided design method of obtaining a reduced ordered binary decision diagram for a circuit in memory comprising the steps of:

applying bf_ite to Boolean operations representative of a circuit to form a reduced ordered binary decision diagram representation in memory comprising nodes each node having an associated pointer address;

determining a variable index of a node from the pointer address of the node without fetching the node from memory;

storing nodes in memory so as to associate contiguous blocks of memory with each variable index and to locate nodes having the same variable index in substantially contiguous memory space;

forming a block-index table in a memory;

selecting values of predetermined bits of the address of a node in a reduced ordered binary decision diagram to determine the memory block in which said node is located; and looking up in said block-index table a variable index associated with the memory block in which said node is located, thereby determining the variable index of said node without fetching said node from memory.

8. A computer-aided design method as set forth in claim 7, where ITE requests are processed in order of increasing top variable indices by maintaining a request queue for each index and processing the request queues in order of increasing index.

9. A computer-aided design method as set forth in claim 8, where ITE requests in a queue are processed in the order of increasing top-variable index of the new ITE requests generated by the ITE request.

10. A computer-aided design method as set forth in claim 9, further comprising checking for redundant nodes for each index according to the order of increasing top-variable index of the children nodes and removing any redundant node.

11. A computer-aided design method of obtaining a reduced ordered binary decision diagram for a circuit in memory comprising the steps of:

applying algorithm bf_ite_apply to Boolean operations representative of a circuit to obtain a binary decision diagram;

applying algorithm bf_ite_reduce to said binary decision diagram to remove redundant binary decision diagram (BDD) nodes to obtain a reduced ordered binary decision diagram representation in memory comprising BDD nodes each BDD node having an associated pointer address;

determining a variable index of a BDD node from the pointer address of the BDD node without fetching the BDD node from memory; and storing BDD nodes in memory so as to associate contiguous blocks of memory with each variable index and to locate BDD nodes having the same variable index in substantially contiguous memory space.

12. A computer-aided design method of obtaining a reduced ordered binary decision diagram for a circuit in memory comprising the steps of:

applying algorithm bf_ite_apply to Boolean operations representative of a circuit to be fabricated to obtain a binary decision diagram;

applying algorithm bf_ite_reduce to said binary decision diagram to remove redundant nodes to obtain a reduced ordered binary decision diagram representation in memory comprising nodes each node having an associated pointer address;

determining a variable index of a node from the pointer address of the node without fetching the node from memory;

storing nodes in memory so as to associate contiguous blocks of memory with each variable index and to locate nodes having the same variable index in substantially contiguous memory space;

forming a block-index table in a memory;

selecting values of predetermined bits of the address of a node in said reduced ordered binary decision diagram to determine the memory block in which said node is located; and looking up in said block-index table a variable index associated with the memory block in which said node is located, thereby determining the variable index of said node without fetching said node from memory.

13. A computer-aided design method as set forth in claim 12, where ITE requests are processed in order of increasing top-variable indices by maintaining a request queue for each index and processing the request queues in order of increasing index.

14. A computer-aided design method as set forth in claim 13, where ITE requests in a queue are processed in the order of increasing top-variable index of the new ITE requests generated by the ITE request.

15. A computer-aided design method as set forth in claim 14, where removing redundant nodes comprises checking for redundant nodes for each index according to the order of increasing top-variable index of the children nodes and removing any redundant node.

* * * * *